(12) United States Patent
Shi et al.

(10) Patent No.: US 8,541,813 B1
(45) Date of Patent: Sep. 24, 2013

(54) HOMOJUNCTION TYPE HIGH-SPEED PHOTODIODE

(75) Inventors: Jin-Wei Shi, Taipei (TW); Kai-Lun Chi, New Taipei (TW)

(73) Assignee: National Central University, Jhongli (TW)

( * ) Notice: Subject to any disclaimer, the term of this patent is extended or adjusted under 35 U.S.C. 154(b) by 0 days.

(21) Appl. No.: 13/549,425

(22) Filed: Jul. 14, 2012

(30) Foreign Application Priority Data

Jul. 5, 2012 (TW) .............................. 101124313 A

(51) Int. Cl.
*H01L 21/02* (2006.01)
(52) U.S. Cl.
USPC ........... 257/184; 257/198; 257/432; 257/488; 257/E21.09; 257/E29.336; 257/E31.061; 257/E31.069; 257/E31.128
(58) Field of Classification Search
USPC .................. 257/53, 184–199, 429–432, 458, 257/488, E21.09, 29.189, 336, 31.002–0.005, 257/61–69, 128
See application file for complete search history.

(56) References Cited

U.S. PATENT DOCUMENTS

| | | | | |
|---|---|---|---|---|
| 5,148,267 A * | 9/1992 | Ty Tan et al. | ................. | 257/191 |
| 5,557,117 A * | 9/1996 | Matsuoka et al. | ............ | 257/184 |
| 6,740,908 B1 * | 5/2004 | Giboney | ........................ | 257/185 |
| 7,045,833 B2 * | 5/2006 | Campbell et al. | ............. | 257/186 |
| 7,202,102 B2 * | 4/2007 | Yao | .................................. | 438/69 |
| 7,468,503 B2 * | 12/2008 | Ko et al. | ..................... | 250/214.1 |
| 8,384,198 B2 * | 2/2013 | Yasutake | ........................ | 257/656 |
| 2004/0056250 A1 * | 3/2004 | Wang et al. | ...................... | 257/53 |
| 2006/0138313 A1 * | 6/2006 | Tennant et al. | ................ | 250/226 |
| 2006/0226343 A1 * | 10/2006 | Ko | .............................. | 250/214.1 |
| 2007/0096240 A1 * | 5/2007 | Yao | .................................. | 257/458 |
| 2008/0179701 A1 * | 7/2008 | Lin et al. | ........................ | 257/458 |
| 2009/0315073 A1 * | 12/2009 | Shi et al. | ........................ | 257/185 |
| 2011/0164645 A1 * | 7/2011 | Shi et al. | ..................... | 372/50.11 |
| 2012/0153417 A1 * | 6/2012 | Shi et al. | ........................ | 257/432 |
| 2013/0161780 A1 * | 6/2013 | Kizilyalli et al. | .............. | 257/488 |

\* cited by examiner

*Primary Examiner* — Michael Lebentritt
(74) *Attorney, Agent, or Firm* — Jackson IPG PLLC

(57) ABSTRACT

A homojunction type high-speed photodiode has an active area of greater than at least 50 microns (μm) or preferably greater than 60 microns (μm) in diameter, which has an p-i-n junction epitaxial layer formed on a semiconductor substrate and includes a first ohmic contact layer, an absorption layer, a collector layer and a second ohmic contact layer. No more absorbance occurs in the collector layer of InGaAs, by means of completely absorbing the photon energy in advance by the absorption layer in which the absorption layer has powerful optical absorption constant. Not only can the prior art problems be solved, such as surface absorbance, but also improved electron transport can be achieved by using InGaAs as the constructing material, compared to other materials. The resistance capacitance (RC) for the entire structure can be significantly reduced, and the limitations to the bandwidth resulted from the carrier transport time can be improved.

13 Claims, 3 Drawing Sheets

HOMOJUNCTION TYPE HIGH-SPEED PHOTODIODE

BACKGROUND OF THE INVENTION

1. Field of the Invention

The present invention relates to a high-speed photodiode, especially relates to a homojunction type one, in particular, to a homojunction type high-speed photodiode which has a graded bandgap absorption layer with huge optical absorption constant (>2 μm$^{-1}$) to absorb more than 95% of incident photons to avoid any surface recombination. Furthermore, the homojunction type high-speed photodiode has an epitaxial layer structure of indium gallium arsenide (InGaAs) which avoids any absorbance while offers the effect of ultra-high-speed electron drift.

2. Description of Related Art

The light emitting diode is able to convert optical signals into electrical signals of components. Therefore, the response speed and quantum efficiency are essential for a high-speed photodiode. For optical interconnect (OI) applications, high-density VCSEL arrays requires easy coupling of light and the light detector array with high density. Therefore, an optical detector of normal incidence structure is much more suitable than other structures. However, the optical detector usually requires external reverse bias (−3 to −5V) to maintain the high-speed operation, resulting in the electric power consumption and the demand for additional bias circuit.

A traditional PIN light diode consists of a depletion layer (i.e., I area) of narrow bandgap located between a P-type layer of wide bandgap and an N-type layer. The absorbance area locates in the depletion layer. Incident photons are absorbed in the depletion layer. At the same time, electron-hole pairs are stimulated to form. The electrons and electrical holes are swept into the P-type layer and the N-type layer due to acceleration by an electric field in the depletion layer, and form a photocurrent accordingly. Taking into account that the hole speed is much slower than the electron speed, the hole tends to accumulate in intrinsic area, causing the electric field shielding effect which makes the internal electric field smaller. In such situation, carriers discharge slows down, adversely affecting the output power. The increase in the thickness of the depletion layer contributes to the decrease in the limit to the RC bandwidth. If the depletion layer too thick, it results in the carrier drift time too long and the response speed becomes slow. If the thickness of the depletion layer reduces, then the carrier drift time can be shortened while the saturation current increases. Whereas, it will cause the capacitance to become larger, the bandwidth to decrease, and the quantum efficiency to decrease accordingly. In addition, since the equivalent mass of the holes is heavy, such components must usually be operated at bias of more than −3 volts (V) in order to accelerate the transfer of the holes. Thus, it is obvious that the component speed will become too slow due to the electric field inside the depletion layer is too small and the hole drift speed is too slow, if the traditional PIN light diode is operated with any bias. To increase the built-in electric field needs to enlarge the energy gap of depletion layer. However, such an approach will result in a substantial decline in the efficiency of the absorbance.

A single-carrier transmission light emitting diode usually has a P-type narrow band absorption layer and a wide band collector layer. The P-type narrow band absorption layer is usually neutral and most of its carrier (hole) can quickly flip the sheets to the metal it contacts. Therefore, in a single-carrier transmission optical detector, the electron can be said to be the sole working charge. The electron transmission time (including the time the electrons passing through the transport layer and the absorbing layer) determines the transient time of the single-carrier transmission light detector. Currently, the InGaAs—InP single-carrier transmission light emitting diode has been widely used at the optical communication band of 1550 nm. If it is used at the optical communication band of 650 nm, the energy absorbed by the light emitting diode made of InP is fairly large, disadvantageously collecting unwanted electron-hole pairs in the collection layer. The special electric field effect caused by the holes staying in the absorbance area will reduce the high-speed performance of the components.

Recently, with the use of the single-carrier transmission light detector structure, the zero-bias operation demonstrates the performance of fast and appropriate response. Thus, for fulfilling the demand in the green Internet in recent years, the application of the light emitting diode in the optical link sector have attracted more and more attention. However, the current technology cannot satisfies the requirement that the diameter of the active area should be greater than 50 microns (μm) in order to facilitate optical alignment and package while retaining the operation at high speed (25 Gbps) and low energy consumption of component. Therefore, there is a need of a new structure that can meet the need for the user in practical use.

SUMMARY OF THE INVENTION

This present invention aims at solving the problems in the prior art and providing a homojunction type high-speed photodiode in which the photon energy can be completely absorbed in advance by an absorption layer in which a graded bandgap absorption layer has powerful optical absorption constant (>2 μm$^{-1}$) to avoid the surface recombination. Thereby, no absorbance occurs in the collector layer of InGaAs. Not only the problems in the prior art such as the problem of surface absorbance can be solved, but also improved electron transport can be obtained by using InGaAs as the constructing material, compared to other materials. The resistance capacitance (RC) for the entire structure itself can be significantly reduced, and the limitations to the bandwidth resulted from the carrier transport time can be improved.

In order to achieve the above and other objectives, the homojunction type high-speed photodiode has an active area of greater than at least 50 microns (μm) or preferably greater than 60 microns (μm) in diameter, which has an p-i-n junction epitaxial layer formed on a semiconductor substrate and includes a first ohmic contact layer, an absorption layer, a collector layer and a second ohmic contact layer. Such a diode is applicable to optical communication bands covering from 650 nanometers (nm) and 1550 nm.

The first ohmic contact layer is a P-type electrode. The second ohmic contact layer is a N-type electrode. The absorption layer is between the first and second ohmic contact layers, and has part of a surface partially exposed to a window layer covered by the first ohmic contact layer, a graded p-doping absorption layer, and a graded bandgap absorption layer between the window layer and the graded P-doping absorption layer to absorb an incident light and further convert the incident light into carriers. The collector layer is between the absorption layer and the second ohmic contact layer.

In one preferred embodiment, the absorption layer absorbs more than 95% of incident photons.

In one preferred embodiment, the absorption layer has the thickness of 0.88-1.32 μm, preferably 1.1 μm.

In one preferred embodiment, the window layer and the graded bandgap absorption layer respectively have thickness of 0.4-0.6 μm, preferably 0.5 μm.

In one preferred embodiment, the graded P-doping absorption layer has a thickness of 0.48~0.72 μm, preferably 0.6 μm.

In one preferred embodiment, the collector layer is indium gallium arsenide (InGaAs), and has the thickness of 3.04-4.56 μm, preferably 3.8 μm In one preferred embodiment, the window layer is InAlAs or indium phosphide (InP)

In one preferred embodiment, the graded bandgap absorption layer is InAlGaAs or InGaInAsP.

In one preferred embodiment, the graded P-doping absorption layer is P-type InGaAs.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
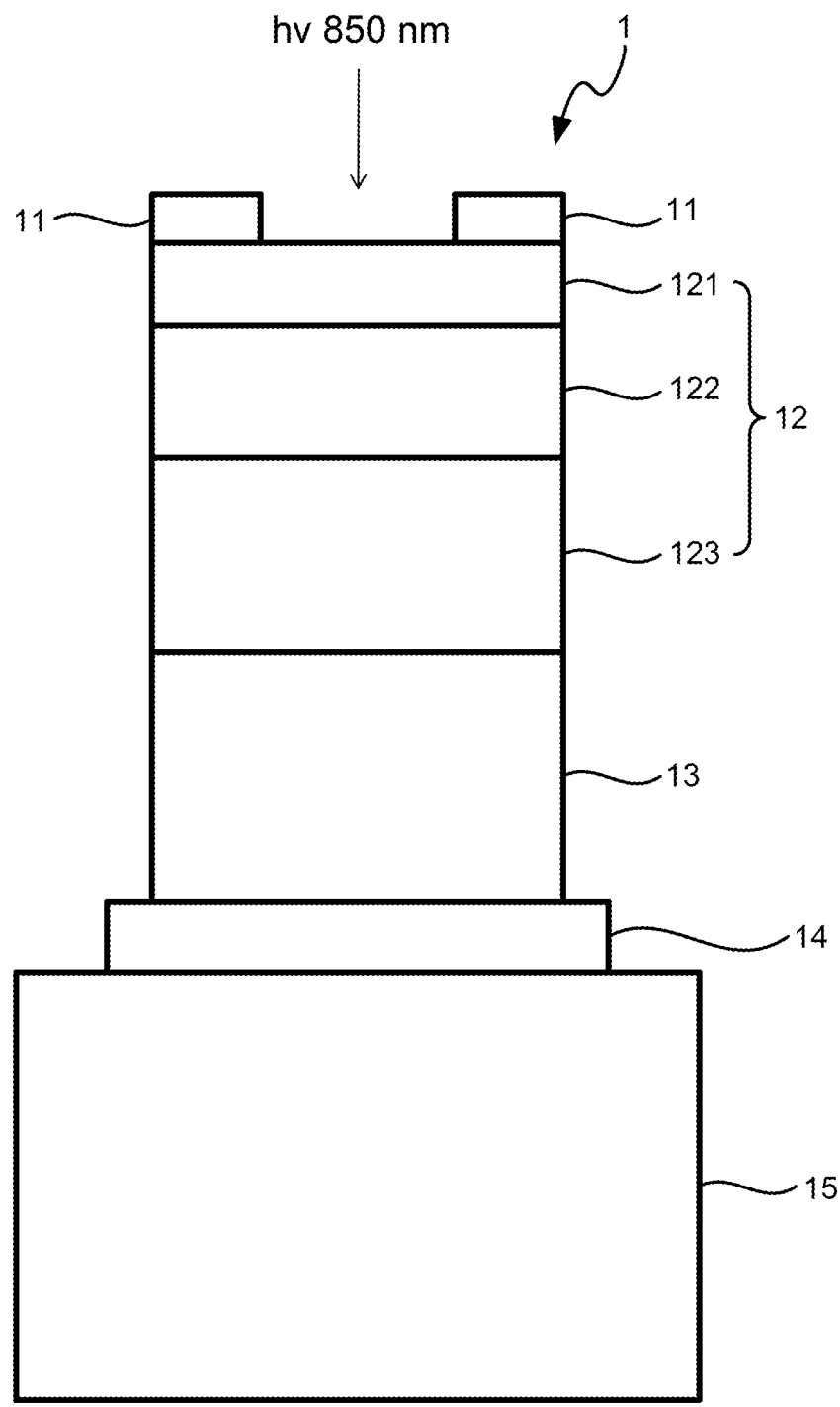
FIG. 1 a schematic, cross sectional view of a homojunction type high-speed photodiode according to one embodiment of the invention.
Figure 2:
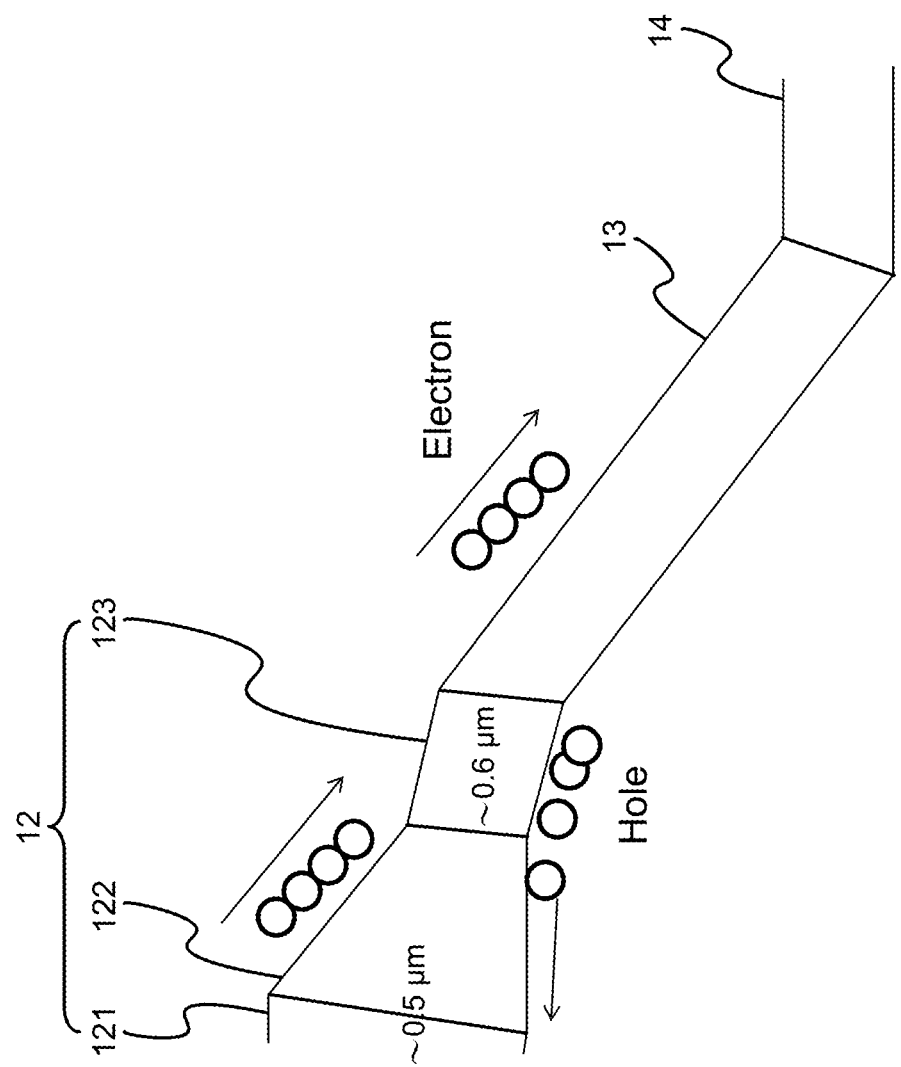
FIG. 2 is a schematic view of energy band distribution of a homojunction type high-speed photodiode according to one embodiment of the invention.

FIG. 1 is a schematic, cross sectional view of a homojunction type high-speed photodiode according to one embodiment of the invention. FIG. 2 is a schematic view of energy band distribution of a homojunction type high-speed photodiode according to one embodiment of the invention. As shown, the homojunction type high-speed photodiode of the invention has an active area of greater than at least 50 microns (μm) or preferably greater than 60 microns (μm) in diameter. Furthermore, the homojunction type high-speed photodiode has an epitaxial layer structure 1 which functions as a p-i-n junction epitaxial layer formed on a semiconductor substrate 15 and at least includes a first ohmic contact layer 11, an absorption layer 12, a collector layer 13 and a second ohmic contact layer 14.

The absorption layer 12 is set between the first and second ohmic contact layers 11, 14, and has the thickness of 0.88-1.32 μm. The absorption layer 12 contains part of a surface partially exposed to a window layer 121 covered by the first ohmic contact layer 11, a graded P-doping absorption layer 123, and a graded bandgap absorption layer 122 between the window layer 121 and the graded P-doping absorption layer 123 in order to absorb incident lights and therefore transmit into carriers. The window layer 121 and the graded bandgap absorption layer 122 respectively have thickness of 0.4-0.6 μm. The graded P-doping absorption layer 123 has a thickness of 0.48~0.72 μm.

The collector layer 13 is indium gallium arsenide in one embodiment, and set between the graded P-doping absorption layer 123 in the absorption layer 12 and the second ohmic contact layer 14. The collector layer 13 has a thickness of 3.04-4.56 μm, and is used to collect the carriers and lower capacitance.

The first ohmic contact layer 11 is a P-type electrode in one embodiment, and can be made of P-type InGaAs. It can form an ohmic contact electrical interface through the underlying window layer 121 made of InAlAs. The material for the window layer 121 can be indium phosphide (InP) as well. Furthermore, the graded bandgap absorption layer 122 can be InAlGaAs or GaInAsP. The graded P-doping absorption layer 123 can be P-type InGaAs, for example. In addition, the second ohmic contact layer 14 is doped N-type InGaAs N-type electrode. Thereby, a novel homojunction type high-speed photo diode is achieved.

The homojunction type high-speed photodiode of the present invention is applicable to optical communication bands covering from 650 nanometers (nm) and 1550 nm. The principle it works is shown in FIG. 2. In one preferred embodiment which an incident light having light band of 850 nm is taken, when incident photons enter the absorption layer 12 of about 1.1 μm in thickness (where the thickness between the window layer 121 of P-type InAlAs to the graded bandgap absorption layer 122 of InAlGaAs is about 0.5 μm, and the thickness between the graded P-doping absorption layer 123 of P-type InGaAs is about 0.6 μm), the window layer 121 of InAlAs can be used to avoid any surface recombination, while the graded bandgap absorption layer 122 and the graded P-doping absorption layer 123 can accelerate the diffusion and restructure the absorption process in order to contribute to avoid the surface recombination. In such way, the absorption layer 12 can absorb more than 95% of incident photons so that InGaAs can simply be used as the collector layer 13 without absorption. Thereby, electrons whose drifting velocity is faster than electric holes can function as active carriers running in the entire epitaxial layer structure of the photodiode, so as to shorten the carrier drifting time. Therefore, ultra-high-speed electron drift can be reached when the electrons drift in the collector layer 13.

Figure 3:
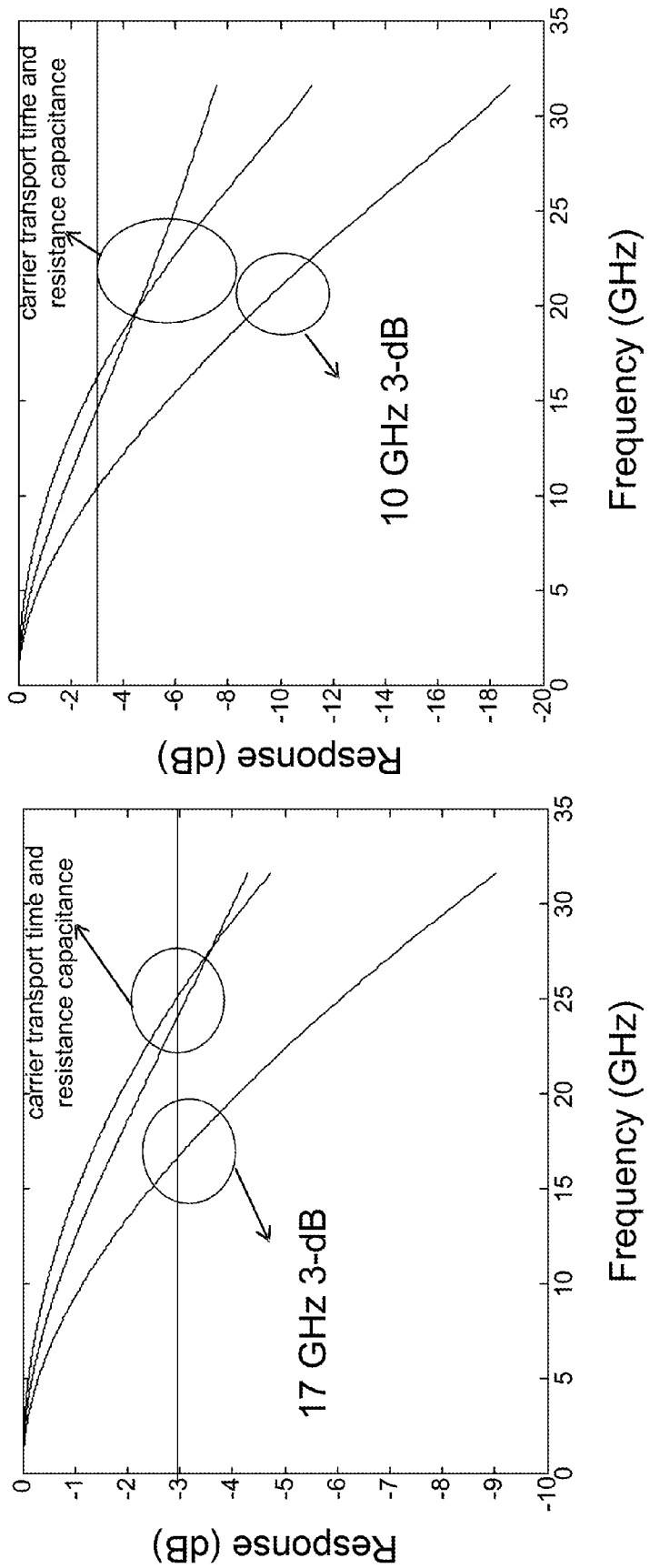
FIG. 3 is a schematic view of comparison of analog frequency response between an photodiode of the invention and a conventional p-i-n photodiode.

FIG. 3 is a schematic view of comparison of analog frequency response between an photodiode of the invention and a conventional p-i-n photodiode. As shown, after simulation, the photodiode of the invention improves the relationship between RC bandwidth limitations and the hole-transport time, as shown at the left side of FIG. 3. It is evident that the homojunction type high-speed photodiode of the invention works at 25 Gbps (17 GHz, 3-dB bandwidth) at the conditions that the active area has the diameter of 60 μm, the absorption layer is 1.1 μm in thickness (the thickness between the window layer and the graded bandgap absorption layer is 0.5 μm, and the thickness of the graded P-doping absorption layer is 0.6 μm), and the collector layer is of 3.8 μm in thickness. The minority of electrons have mobility rate of 5000 $cm^2$/V-sec in simulation. The drift velocity of the electrons in the InGaAs collector layer is $3 \times 10^5$ m/sec. The results demonstrate that the design of the structure of invention which has the active area of 60 μm in diameter realizes the 3-dB bandwidth of 17 GHz.

In addition, in another preferred embodiment (as shown at the right side of FIG. 3), the conventional diode only reaches the hole drift velocity of $0.5 \times 10^5$ m/sec in the collector layer during the simulation operated at 10 Gbps, when the active area has the diameter of 60 μm and the absorption layer 1.7 μm in thickness (optimized). The results demonstrate that compared to the conventional p-i-n structure, the structure of the invention having the active area of 60 μm in diameter obviously has a higher bandwidth 3-dB (17 v.s. 10 GHZ) which favors the operation at 25 Gbps.

In light of above, the present invention can overcome currently existing technical limitations such as not capable of using InGaAs as the collector layer. Furthermore, no absorbance occurs in the collector layer of InGaAs, by means of completely absorbing the photon energy in advance by the absorption layer in which the graded bandgap absorption layer has powerful optical absorption constant ($>2$ $\mu m^{-1}$) to avoid the surface recombination. Thereby, not only the problems in the prior art such as the problem of surface absorbance can be solved, but also improved electron transport can be obtained by using InGaAs as the constructing material, compared to AlGaAs, InP and GaAs. The resistance capacitance (RC) for the entire structure can be significantly reduced, and the limitations to the bandwidth resulted from the carrier transport time can be improved.

In summary, the homogenous junction-type high-speed photodiode of the present invention can effectively improve the shortcomings in the prior art. By means of completely absorbing the photon energy in advance by the absorption layer in which the graded bandgap absorption layer has powerful optical absorption constant ($>2$ $\mu m^{-1}$) to avoid the surface recombination, no absorbance occurs in the collector layer of InGaAs. The problem of surface absorbance in the prior art can be solved. Additionally, by using InGaAs as the constructing material, compared to other materials, the electron transport can be improved. The RC for the structure itself can be significantly reduced and the limitations to bandwidth resulted from the carrier transport time.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A homojunction type high-speed photodiode, having a structure of p-i-n junction epitaxial layer, and comprising:
   a first ohmic contact layer, being of P-type electrode;
   a second ohmic contact layer, being of N-type electrode;
   an absorption layer, between the first and second ohmic contact layers, and having part of a surface partially exposed to a window layer covered by the first ohmic contact layer, a graded p-doping absorption layer, and a graded bandgap absorption layer between the window layer and the graded P-doping absorption layer to absorb an incident light and further convert into carriers;
   a collector layer, between the absorption layer and the second ohmic contact layer to collect the carriers and reduce capacitance.

2. The homojunction type high-speed photodiode of claim 1, further comprising an active area of greater than at least 50 microns ($\mu m$) or preferably greater than 60 microns ($\mu m$) in diameter.

3. The homojunction type high-speed photodiode of claim 1, wherein the absorption layer absorbs more than 95% of incident photons.

4. The homojunction type high-speed photodiode of claim 1, wherein the absorption layer has the thickness of 0.88-1.32 $\mu m$.

5. The homojunction type high-speed photodiode of claim 1, wherein the window layer and the graded bandgap absorption layer respectively have thickness of 0.4-0.6 $\mu m$.

6. The homojunction type high-speed photodiode of claim 1, wherein the graded P-doping absorption layer has a thickness of 0.48~0.72 $\mu m$.

7. The homojunction type high-speed photodiode of claim 1, wherein the collector layer is indium gallium arsenide (InGaAs), and has the thickness of 3.04-4.56 $\mu m$.

8. The homojunction type high-speed photodiode of claim 1, wherein the window layer is InAlAs or indium phosphide (InP).

9. The homojunction type high-speed photodiode of claim 1, wherein the graded bandgap absorption layer is InAlGaAs or InGaAsP.

10. The homojunction type high-speed photodiode of claim 1, wherein the graded P-doping absorption layer is P-type InGaAs.

11. The homojunction type high-speed photodiode of claim 1, wherein the collector layer is between the graded P-doping absorption layer and the second ohmic contact layer.

12. The homojunction type high-speed photodiode of claim 1, wherein the homojunction type high-speed photodiode is formed on a semiconductor substrate and the second ohmic contact layer is N-type InGaAs.

13. The homojunction type high-speed photodiode of claim 1, wherein the homojunction type high-speed photodiode is applicable to optical communication bands covering from 650 nanometers (nm) to 1550 nm.

* * * * *